United States Patent [19]

Shimizu et al.

[11] Patent Number: 4,695,034
[45] Date of Patent: Sep. 22, 1987

[54] FLUID CONTROL DEVICE

[75] Inventors: Tetsuo Shimizu; Kiyoharu Tujimura; Michinori Iwamoto, all of Kyoto, Japan

[73] Assignee: STEC Inc., Kyoto, Japan

[21] Appl. No.: 799,739

[22] Filed: Nov. 19, 1985

[30] Foreign Application Priority Data

Nov. 27, 1984 [JP] Japan .................. 59-249860
Jul. 9, 1985 [JP] Japan .................. 60-152035

[51] Int. Cl.⁴ ............................................. F16K 31/02
[52] U.S. Cl. .............................. 251/129.06; 137/486; 137/487.5
[58] Field of Search ............... 251/129.06; 137/486, 137/487.5

[56] References Cited

U.S. PATENT DOCUMENTS 3,614,486  10/1971  Smiley .................. 251/129.06 X

FOREIGN PATENT DOCUMENTS

2402085  8/1974  Fed. Rep. of Germany .................. 251/129.06
2094940  9/1982  United Kingdom .......... 251/129.06
1106928  8/1984  U.S.S.R. ..................... 251/129.06

Primary Examiner—Arnold Rosenthal
Attorney, Agent, or Firm—Wenderoth, Lind & Ponack

[57] ABSTRACT

A valve body which is driven by a valve body-driving portion constructed from a piezoelectric stack to open and close a valve mouth. The piezoelectric stack consists of piezoelectric disc elements having a thickness of 0.1 to 0.5 mm and a diameter of 10 to 50 mm, whose upper surface and lower surface are both plated, and thin metallic plates each having a thickness of 0.05 to 0.2 mm and being high in electric conductance, are alternately laminated one between the piezoelectric elements by one (the number of piezoelectric elements laminated is 100 to 200). Every other one of the thin metallic plates are connected to a positive polar lead and the remaining plates are connected to a negative polar lead, and a voltage-applying lead wire is connected with each of the lead wires. A driving force transmission member can be provided between the valve body-driving portion and the valve body for amplifying the amount of distortion of the piezoelectric stack to thereby allow adjustment of the amount of movement of the valve body and adapt the structure for handling large volumes of fluid.

19 Claims, 11 Drawing Figures

FLUID CONTROL DEVICE

BACKGROUND OF THE INVENTION

1. Field of the Invention

The present invention relates to a fluid control device such as a flow rate control valve for a mass flow controller, a control valve for various kinds of fluid and a micro-flow rate vacuum valve.

2. Description of the Prior Art

A valve body of a valve of this type has been driven manually, electro-magnetically, pneumatically or by means of a motor. However, since a driving portion is larger than a valve body in construction, it has been very difficult to miniaturize a valve as a whole. Also there has been a defect in that movable portions have a shorter useful life-time.

Figure 11:
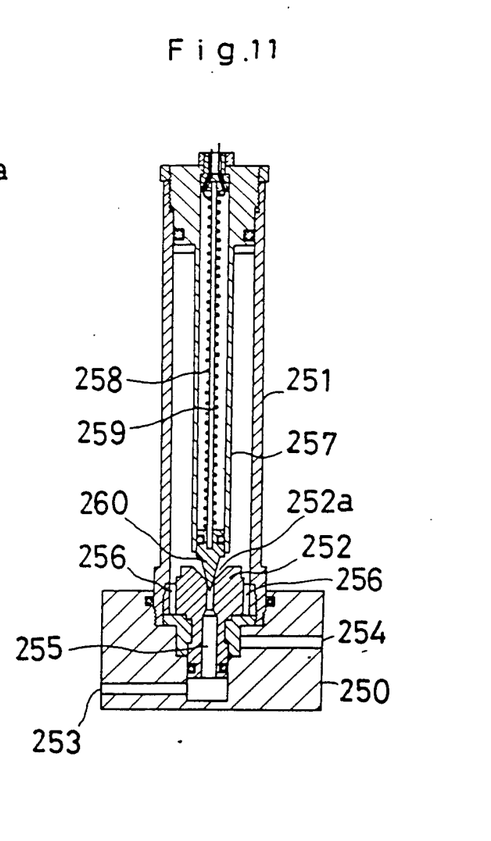
FIG. 11 is a longitudinal sectional view showing a conventional thermally driven valve.

In order to solve this problem, a "thermally driven valve" has been proposed (for example, Japanese Patent Publication No. 59-28794). Referring to FIG. 11 showing one construction example of such a thermally driven valve, 250 designates a base body on which a cylindrical member 251 stands. 252 designates a valve seat provided between a fluid inlet port 253 and a fluid outlet port 254 formed in the base body 250, with 255 and 256 each designating a fluid passage. 257 designates a guide cylinder provided in the cylindrical member 251, said guide cylinder 257 being provided with a thermally expandable body 259 having a heater 258 therewithin. Said thermally expandable body 259 is provided with a valve body 260 for controlling the opening of a valve mouth 252a of the valve seat 252 at the lower end thereof. On heating the thermally expandable body 259 by supplying electrical power to the heater 258, the thermally expandable body 259 is expanded and the opening of the valve mouth 252a is controlled by axial movement of the valve body 260.

However, with a thermally driven valve constructed in the above described manner, since the thermally expandable body 259 is heated by the heater 258 in order to be expanded, disadvantages have occurred in that it takes a long period of time for the thermally expandable body 259 to be expanded to the appointed degree and thus a fast response can not be achieved. Also, the expansion degree of the thermally expandable body 259 is dependent upon an ambient temperature and in order to improve heat conductance, it is impossible to provide too large a diameter to the thermally expandable body 259 and thus it is very flexible. As a result the control accuracy of the opening of the valve mouth 252a is not high, and since the pressure exerted by the valve body 260 due to the expansion of the thermally expandable body 259 is not very large, the valve is unsuitable for applications requiring fluid control of a large flow rate.

SUMMARY OF THE INVENTION

It is a main object of the present invention to provide a small-sized fluid control device which has a long useful life-time, is superior in performance such as response speed and opening controllability, and is able to control even a fluid having a large flow rate.

In order to achieve the above described object, according to the present invention, a piezo-stack is used for a driving portion of a valve body for opening and closing a valve mouth.

BRIEF DESCRIPTION OF THE DRAWINGS

FIGS. 1 to 10 show the embodiments of the present invention, in which

DESCRIPTION OF THE PREFERRED EMBODIMENTS

The preferred embodiments of the present invention will be described below with reference to the drawings.

Figure 1:
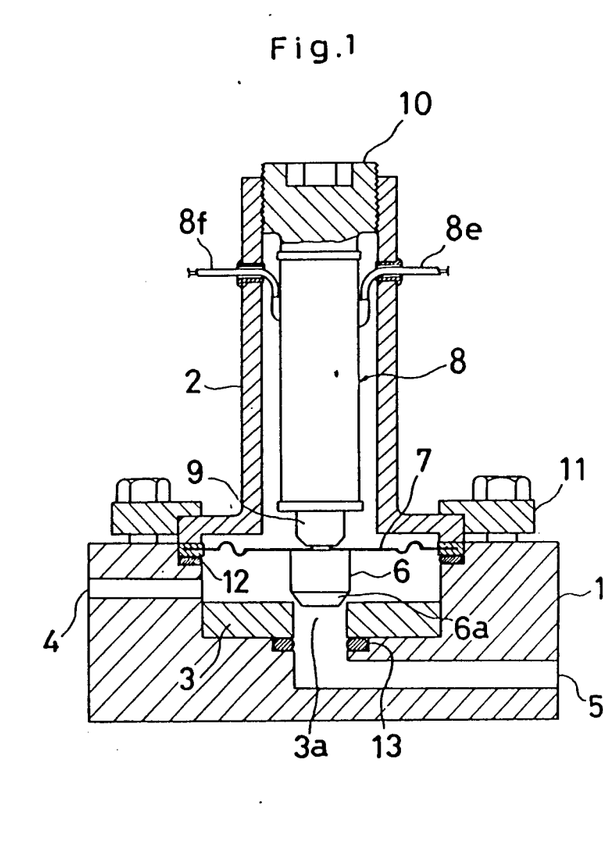
FIG. 1 is a longitudinal sectional view showing a fluid control device of a normally open type.

Referring now to FIG. 1 showing a fluid control device of a "normal open type", 1 designates a base body of the valve, 2 designating a tubular member supported at one end on said base body 1 of the valve. 3 designates a valve seat provided between a fluid inlet port 4 and a fluid outlet port 5 formed in the base body 1 of the valve, 3a designating a valve mouth. 6 designates a valve body for controlling the opening of the valve mouth 3a and is fitted on the lower surface of elastic partition means, such as a diaphragm 7 serving as a partition membrane for forming part of a fluid passage between the inlet port 4 and the outlet port 5. 6a designates a tapered portion formed on the side opposed to the valve seat 3 of the valve body 6.

8 designates a piezoelectric stack of elements provided in the cylindrical member 2 and serving as a valve body-driving portion, 9 designating a pressing portion provided at the lower end of the piezoelectric stack 8. This pressing portion 9 transmits strain force of the piezoelectric stack 8 to the valve body 6. Although the pressing portion 9 is connected with the valve body 6 in the embodiments shown in the drawings, the pressing portion 9 may be adapted to press only the diaphragm 7 to make the valve body 6 dislocate, that is to say it is necessary only to transmit the strain dislocation of the piezoelectric stack 8 to the valve body 6.

Figure 2:
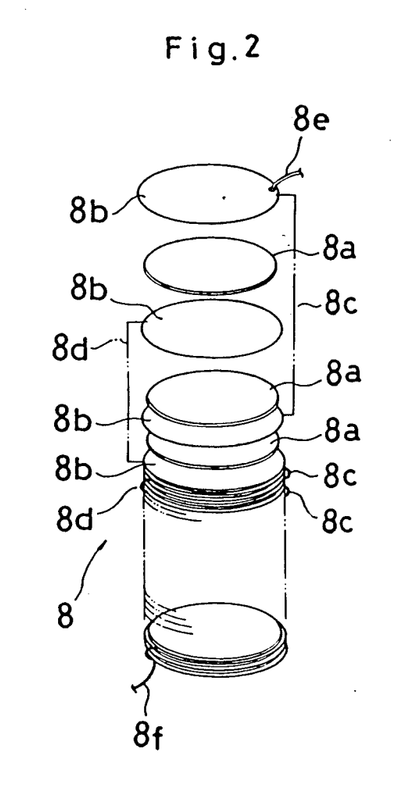
FIG. 2 is a perspective view showing the construction of a piezo-stack used in the present invention.

Referring to FIG. 2 showing one embodiment of the construction of the piezoelectric stack 8, a piezoelectric element 8a (formed of for example lead titanium zirconate) having a thickness of 0.1 to 0.5 mm and a diameter of 10 to 50 mm, whose upper surface and lower surface are both plated, and a thin metallic plate 8b (formed of for example nickel or copper) having a thickness of 0.05 to 0.2 mm (and a diameter nearly equal to that of the piezoelectric element 8), which is superior in electric conductance, are alternately laminated one by one (the number of laminated piezoelectric elements 8a is 100 to 200), every other thin metallic plate 8b being connected together by a positive polar lead 8c and the remaining thin metallic plates 8b being connected together by a negative polar lead 8d, and voltage-applying leads 8e, 8f being provided.

With the piezoelectric stack 8 constructed in the above described manner, upon application of voltage of for example DC 500 V, a strain change of about 60 to 100 μm is produced in the piezoelectric stack 8 in the laminating direction of the piezoelectric elements 8a whereby the valve body 6 is moved downward due to distortion of the piezoelectric elements which move the pressing portion 9.

Referring again to FIG. 1, 10 designates an opening-adjusting screw disposed at the other end of the tubular member 2, 11 designating a cap member for holding the tubular member 2 to the housing 1, and 12, 13 each designating an O-ring serving as a sealing material.

With the above described construction, upon introduction of a fluid into a fluid control device through the inlet port 4, said fluid passes through a gap between the valve seat 3 and the tapered portion 6a of the valve body 6, through the valve mouth 3a and then is discharged from the outlet port 5. Upon application of the appointed voltage to the piezoelectric stack 8, strain force is produced and the pressing portion 9 presses the valve body 6 downward thereby the valve body 6 makes the opening of said gap small. That is to say, the opening of the valve mouth 3a is controlled by the strain force of the piezoelectric stack 8 thereby the flow rate of said fluid is controlled. Upon removal of the voltage from the piezoelectric stack 8, said strain change is removed thereby the downward pressing force by the pressing portion 9 is lost. As a result, the valve body 6 is returned to the original position by the retaining strength of the diaphragm 7 thereby the opening of said gap is returned to the preset normal one.

In addition, it goes without saying that 4 may be an outlet port and 5 may be an inlet port in the above described embodiment.

Figure 3:
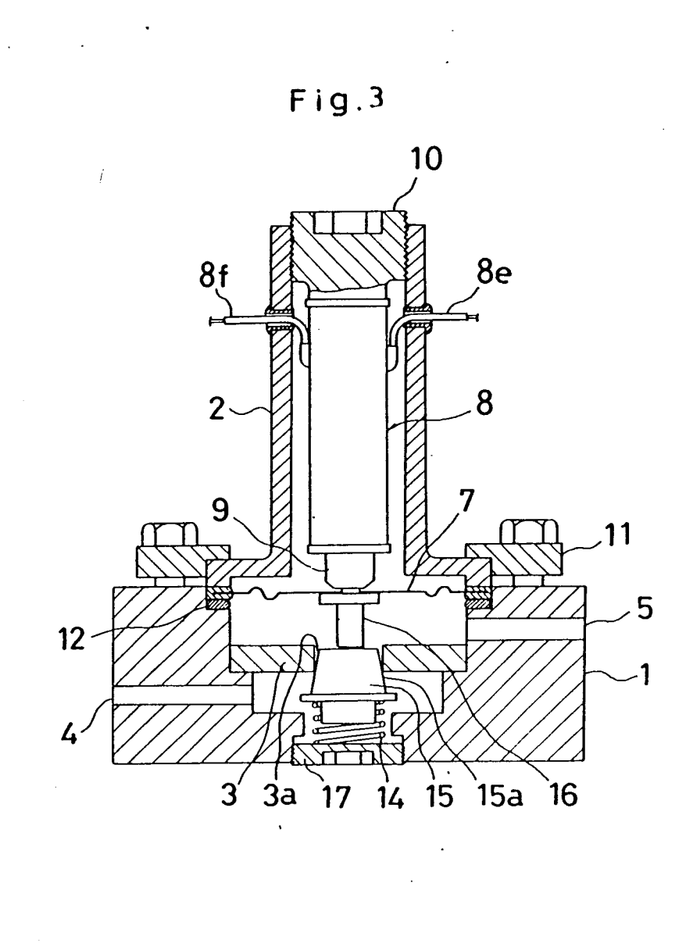
FIG. 3 is a longitudinal sectional view showing a fluid control device of a normally closed type.

FIG. 3 shows another embodiment of the present invention. A "normally closed type" valve is shown. That is to say, the valve mouth 3a of the valve seat 3 is normally closed by a valve body 15 having a tapered portion 15a receiving the spring force from a pressure spring 14. The elastic partition means which comprises the diaphragm 7 is provided with a valve body-opening and closing member 16 on the lower surface thereof so that the strain force of the piezoelectric stack 8 may be added to this opening and closing member 16. The valve body-opening and closing member 16 is moved downward by the strain force of the piezoelectric stack 8 whereby the valve mouth 3a is opened.

In addition, 17 designates an adjusting screw for adjusting the spring force of the pressure spring 14. Other constituent elements are same as those shown in FIG. 1, so that their description is omitted.

Figure 4:
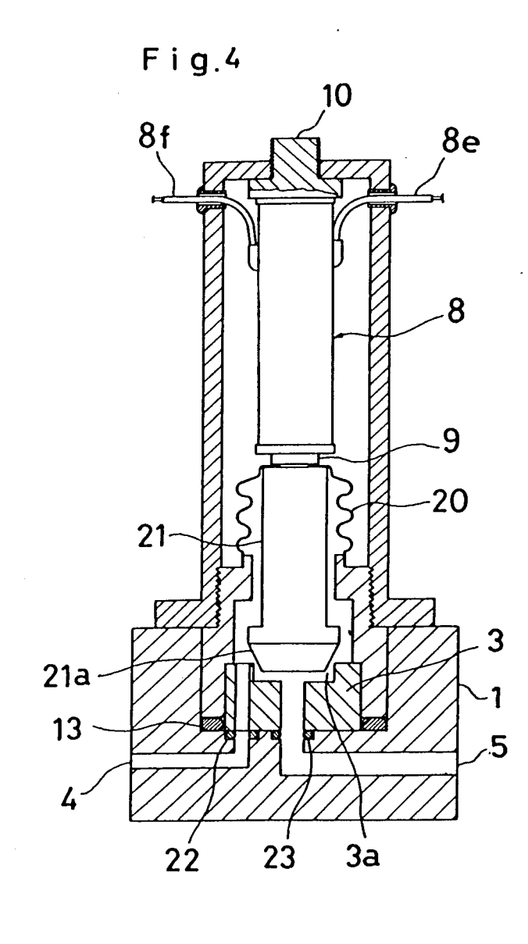
FIG. 4 is a longitudinal sectional view showing another embodiment of the construction of a fluid control device of a normally open type.

FIG. 4 shows still another embodiment of the present invention in which the elastic partition means comprises a bellows shaped member 20 is used for a partition membrane for forming part of a fluid passage between the inlet port 4 and the outlet port 5 in place of the diaphragm used in the above described embodiments. 21 designates a valve body having a tapered portion 21a, with 22 and 23 each designating an O-ring serving as a sealing material. A valve, which is used in this embodiment, is a normally open type one similar to that shown in FIG. 1, so that the description of its operation is omitted.

Although the amount of distortion, which is an output of a valve body-driving portion constructed from a piezoelectric stack, is transmitted to a valve body as it is in the above described embodiments, it may be amplified by means between said valve body-driving portion and said valve body and then transmitted to increase the amount of movement of the valve body relative to the movement produced by the piezoelectric stack in a manner which will be fully described below.

The embodiment constructed in the above described manner will be below described with reference to FIGS. 5 to 10.

Figure 5:
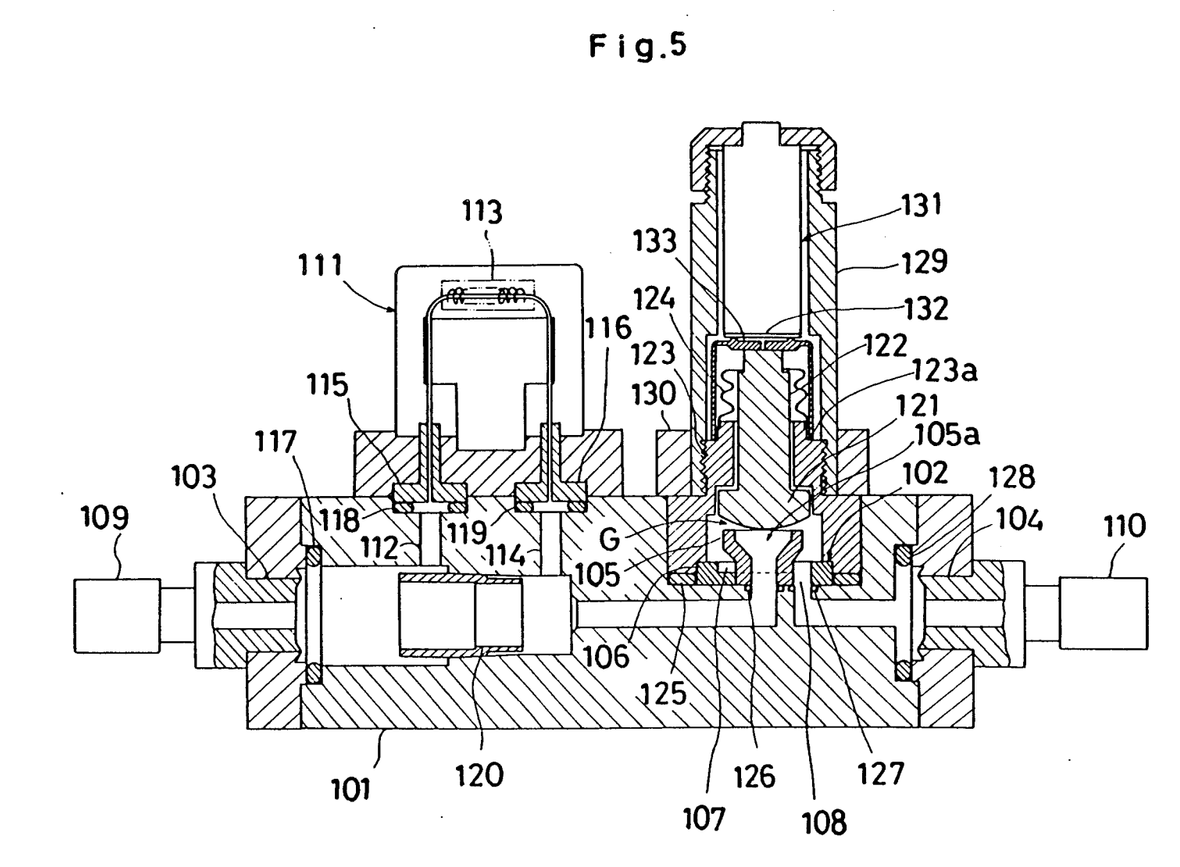
FIG. 5 is a longitudinal sectional view showing a fluid control device of a normally open type.

FIG. 5 shows a mass flow controller serving as a "normally open type" fluid controlling device in which 101 designates a base body of the valve. 102 designates a valve seat block provided between a fluid inlet port 103 and a fluid outlet port 104 formed in said base body or housing 101 of the valve, 105 designating a valve seat, and 105a designating a valve mouth. The valve seat block 102 is provided with passages 107, 108 formed within a base portion 106 thereof. 109 designates a fluid introduction joint detachably mounted on the inlet port 103, 110 designating a fluid discharge joint detachably mounted on the outlet port 104.

111 designates a sensor portion provided on the upstream side of the valve seat 105 adapted to measure the flow rate of a fluid passing through a measurement passage inlet 112 when the fluid passes through a measurement element 113. 114 designates a measurement passage outlet, with 115, 116 each designating a locking nut, and 117, 118, 119 designating a sealing material such as an O-ring. 120 designates a by-pass portion.

121 designates a valve body for controlling the opening of said valve mouth 105a and is held by elastic partition means comprising a bellows shaped member 124 for forming a part of a fluid passage between the fluid inlet port 103 and the fluid outlet port 104 so that the trunk portion 122 thereof may be movable up and down within a valve block 123 and a gap G may be usually formed somewhat between the trunk portion 122 and the valve seat 105. 125, 126, 127, 128 each designate a sealing material such as an O-ring, respectively.

129 designates a tubular cover member standing on the valve base body 101 and is screwed in the valve block 123. 130 designates a locking member. The tubular member 129 is provided with a valve body-driving portion 131 constructed from a piezoelectric stack in the internal upper portion thereof. This valve body-driving portion 131 is constructed as shown in said FIG. 2, so that upon addition of the appointed voltage, the output portion 132 thereof is moved downward.

Figure 6:
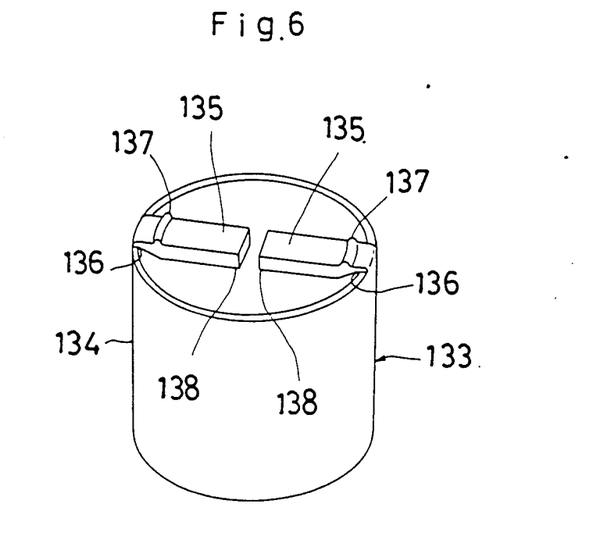
FIG. 6 is a perspective view showing a driving force-transmission member.

133 designates a driving force transmission member means disposed between said valve body 121 and said valve body-driving portion 131. This driving force transmission member 133 is formed by inwardly bending the upper portion of the cylindrical trunk portion 134, as shown in FIG. 6, and comprises a pair of diametrically opposed tongue members 135, 135 which are identical to each other in shape. 136, 136 designate a bent portion where the projections 135, 135 are connected to the cylindrical trunk portion 134 and 137, 137 designate a projection formed on the upper surface of the tongue portions 135, 135 in the vicinity of the bent portions 136, 136. 138, 138 designate movable free end portions of the tongue portions 135, 135. This driving force transmission member 133 is arranged so that the lower end of the trunk portion 134 may be engaged with a receiving seat 123a of said valve block 123.

Figure 7:
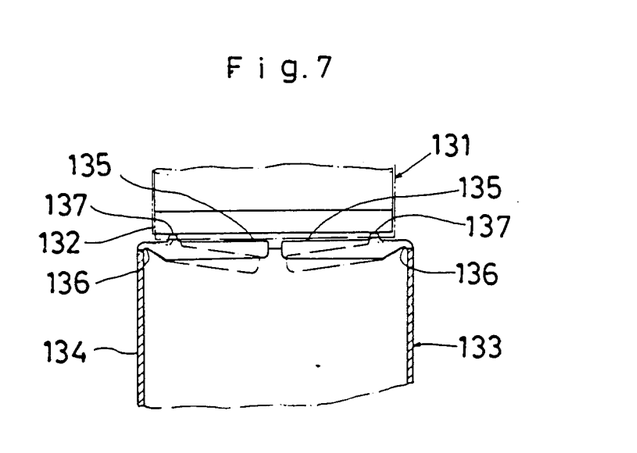
FIG. 7 is a side view showing the vicinity of a tongue member.

Upon application of the downward pressing force from the output portion 132 of the valve body-driving portion 131 to said projections 137, 137, said tongue portions 135, 135 act as pivotable levers with said bent portions 136, 136 as fulcrums whereby the free end portions 138, 138 of the tongue portions 135, 135 are moved downward and are amplified or multiplied in their effect on the valve body by a lever ratio (refer to FIG. 7).

Said driving force transmission member 133 is made of a material, which has a high elasticity, such as stainless steel, spring steel and plastics. It is preferable that a sufficient elasticity be given to the bent portions 136, 136 and the tongue portions 135, 135 should have a sufficient thickness such that they are not easily bent.

Figure 8:
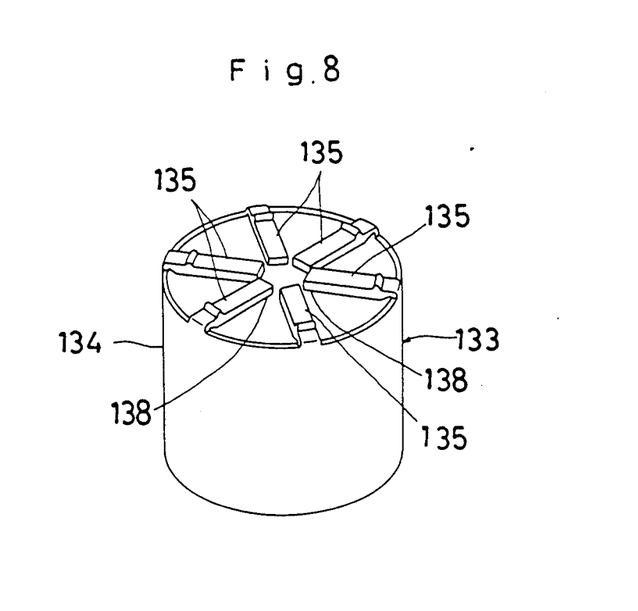
FIG. 8 is a perspective view showing another embodiment of the construction of a driving force-transmission member.

In addition, the shape of said driving force transmission member 133 is not limited to that shown in FIG. 6. For example, as shown in FIG. 8, a plurality of tongue portions 135, whose free end portions 138 are independent of each other, may be radially arranged such that they extend radially inward from the edge of the driving force transmission member. Furthermore, although not shown, only one tongue portion 135 may be used. Said trunk portion 134 can be other than cylindrical in shape and can have, for instance, a two leg-shape and three leg-shape, which can stand up to the pressing force of the valve body-driving portion 131, may be used. In addition, the trunk portion 134 may be longer than that shown in FIGS. 6, 8 and held by members other than the receiving seat 123a of the valve block 123.

Figure 9:
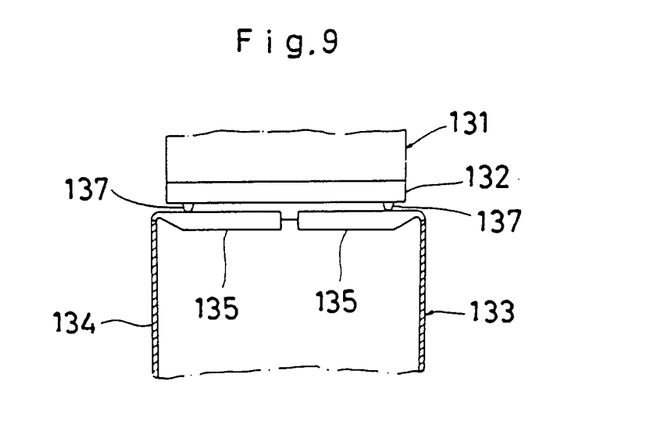
FIG. 9 is a side view showing an embodiment in which a projection member is provided on a valve body-driving portion side.

Also, the projections 137, 137 may be formed on the lower surface of the output pressing portion 132 of the valve body-driving portion 131, as shown in FIG. 9. That is to say, it is necessary only that the valve body-driving portion 131 is brought into point contact or line contact with the driving force transmission member 133 through the projections 137, 137 so that the tongue portion 135 may act as a lever.

In a fluid control device constructed in the above described manner, in the case where tongue portions, whose ratio of a length between the bent portion 136 and the projection 137 to a length between the bent portion 136 and the free end portion 138 was set to 1:5, were used, the amount of distortion or movement of the output portion 132 of the valve body-driving portion 131 is transmitted to the valve body 121 is amplified five times. In short, even though the output portion 132 is slightly distorted, the amount of distortion of the valve body 121 is dramatically increased whereby the opening of the gap G in the valve mouth 105a can be controlled over a wide range and as a result, a large volume of fluid can be controlled. In addition, it goes without saying that said ratio can be set to a desired value.

Figure 10:
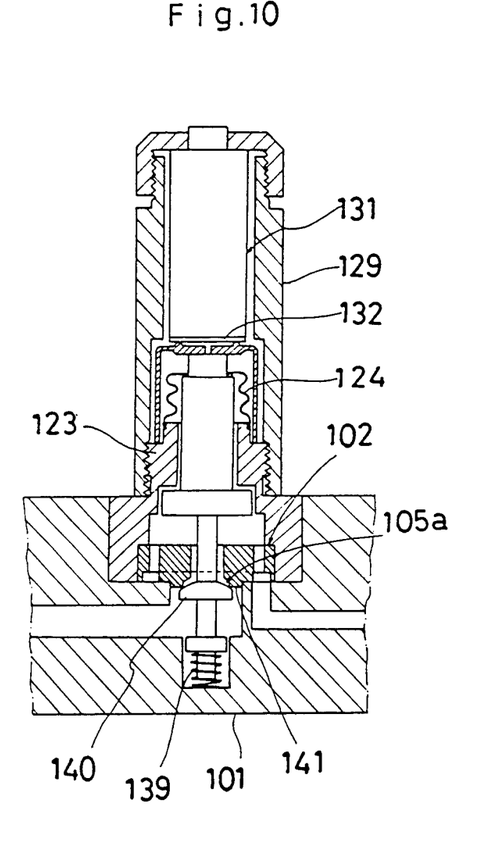
FIG. 10 is a longitudinal sectional view showing a fluid control device of a normally closed type.

Referring to FIG. 10 showing an example in which the present invention is applied to a "normally closed type" fluid control valve, the example shown in FIG. 10 is different from one shown in FIG. 5 only in that a spring 139 is provided and a valve body 140 is usually pressed against a valve seat 141 by the action of the spring 139. Other constituent elements are the same as in the earlier described embodiments. Also in the case of such a construction, the opening of the gap G in the valve mouth 105a can be adjusted over a wide range whereby a large volume of fluid can be controlled.

In the case where the amount of distortion of a valve body-driving portion constructed from a piezoelectric stack is transmitted to said valve body with being amplified, as described above, even though the amount of distortion of said valve body-driving portion is small, it is transmitted to the valve body by amplifying means comprising a driving force transmission member such that the amount of movement of the valve body is amplified by the desired multiplying ratio. As a result, the valve body-driving portion can be of smaller size whereby the fluid control device as a whole can be made more compact.

As described above, according to the present invention, a valve body for opening and closing a valve mouth is pressed and driven by the strain force of a piezoelectric stack, so that a valve body-driving portion can be miniaturized whereby a valve of this type can be reduced in size. Also, there are few relatively movable parts, so that abrasion and the like do not occur whereby the useful life of the valve can be increased. Furthermore, the time for generating the strain in a piezoelectric stack is remarkably short, so that the response speed of the valve is remarkably increased and the opening of valve body can be accurately regulated. Also, the strain of a piezoelectric stack is instantaneously generated and large, so that the pressure to a valve body is increased a large volume of fluid can be easily controlled and as a result, a fluid control device, which is superior in performance, can be provided.

What is claimed is:

1. A fluid control device, comprising:
   a housing having an inlet, an outlet, and a fluid passage connecting said inlet and said outlet; and
   valve means disposed in said housing for preventing fluid from passing from said inlet to said outlet, said valve means comprising a valve seat forming part of said fluid passage, a movable valve body having one end which engages said valve seat to prevent fluid from passing from said inlet to said outlet, a piezoelectric stack means disposed on said housing for moving said valve body towards said valve seat in response to electrical energy supplied to said piezoelectric stack means, elastic partition means forming another part of said fluid passage connected between said piezoelectric stack means and the other end of said valve body for providing a fluid tight seal between said passage and said piezoelectric stack means, and driving force transmission member means connected to said piezoelectric stack means for amplifying the amount of movement of said valve body towards said valve seat relative to the amount of movement produced by only said piezoelectric stack means when electrical energy is supplied to said piezoelectric stack means.

2. The fluid control device of claim 1, wherein said piezoelectric stack means comprises a plurality of piezoelectric elements, a plurality of thin metallic plates, each of said plurality of piezoelectric elements being separated by one of said plurality of thin metallic plates to form a stack, a positive lead wire connected to every other one of said plurality of piezoelectric elements and a negative lead wire connected to the remaining piezoelectric elements, said stack of piezoelectric elements being movable in response to voltage applied across said leads to move said valve body.

3. The fluid control device of claim 2, wherein said piezoelectric stack means further includes a tubular member having one end thereof mounted on said housing, adjusting means disposed at the other end of said tubular member for supporting one end of said stack of piezoelectric elements and adjusting the position of said stack of piezoelectric elements within said tubular member.

4. The fluid control device of claim 3, wherein said piezoelectric stack means further includes a pressing portion disposed on a free end of said stack of piezoelectric elements for moving said valve body toward said valve seat.

5. The fluid control device of claim 3, wherein said elastic partition means comprises a flexible bellows shaped member disposed within said tubular member and extending between said housing and said valve body to provide a fluid tight seal therebetween.

6. A fluid control device, comprising:
a housing having an inlet, an outlet, and a fluid passage connecting said inlet and said outlet; and
valve means disposed in said housing for preventing fluid from passing from said inlet to said outlet, said valve means comprising a valve seat forming part of said fluid passage, a movable valve body having one end which engages said valve seat to prevent fluid from passing from said inlet to said outlet, spring means disposed between said movable valve body and said housing for maintaining said valve body in a normally closed position in contact with said valve seat, a valve body opening and closing member for moving said valve body away from said valve seat to allow fluid to pass from said inlet to said outlet, elastic partition means connected to said valve body opening and closing member and forming another part of said fluid passage, a piezoelectric stack means disposed on said housing for moving said valve body opening and closing member towards said valve body to move said valve body away from said valve seat in response to electrical energy supplied to said piezoelectric stack means and driving force transmission member means connected to said piezoelectric stack means for amplifying the amount of movement of said valve body away from said valve seat relative to the amount of movement produced by only said piezoelectric stack means when electrical energy is supplied to said piezoelectric stack means.

7. The fluid control device of claim 6, wherein said piezoelectric stack means comprises a plurality of piezoelectric elements, a plurality of thin metallic plates, each of said plurality of piezoelectric elements being separated by one of said plurality of thin metallic plates to form a stack, a positive lead wire connected to every other one of said plurality of piezoelectric elements and a negative lead wire connected to the remaining piezoelectric elements, said stack of piezoelectric elements being movable in response to voltage applied across said leads to move said valve body opening and closing member.

8. The fluid control device of claim 7, wherein said piezoelectric stack means further includes a tubular member having one end thereof mounted on said housing, adjusting means disposed at the other end of said tubular member for supporting one end of said stack of piezoelectric elements and adjusting the position of said stack of piezoelectric elements within said tubular member.

9. The fluid control device of claim 8, wherein said piezoelectric stack means further includes a pressing portion disposed on a free end of said stack of piezoelectric elements for moving said valve body away from said valve seat.

10. The fluid control device of claim 6, wherein said elastic partition means comprises a flexible bellows shaped member disposed within said tubular member and extending between said housing and said valve body opening and closing member to provide a fluid tight seal therebetween.

11. The fluid control device of claim 6, wherein said driving force transmission member means comprises at least one tongue portion pivotally mounted on a support fixed to said housing, said tongue portion having at one end thereof a projection engaging said piezoelectric stack means and a free end at the other end thereof engaging said valve body opening and closing member, said free end being movable away from said piezoelectric stack means to a greater extent than the distance moved by said piezoelectric stack means in response to electrical energy supplied to said piezoelectric stack means.

12. The fluid control device of claim 11, wherein said at least one tongue portion comprises a plurality of tongue portions.

13. A fluid control device, comprising:
a housing having an inlet, an outlet, and a fluid passage connecting said inlet and said outlet; and
valve means disposed in said housing for preventing fluid from passing from said inlet to said outlet, said valve means comprising a valve seat forming part of said fluid passage, a movable valve body which engages said valve seat to prevent fluid from passing from said inlet to said outlet, a piezoelectric stack means disposed on said housing for moving said valve body in response to electrical energy supplied to said piezoelectric stack means, elastic partition means connected between said piezoelectric stack means and said valve body and forming another part of said fluid passage for providing a fluid tight seal between said passage and said piezoelectric stack means and driving force transmission member means connected to said piezoelectric stack means for amplifying the amount of movement of said valve body relative to the amount of movement produced by said piezoelectric stack means when electrical energy is supplied to said piezoelectric stack means.

14. A fluid control device, comprising:
a housing having an inlet, an outlet, and a fluid passage connecting said inlet and said outlet;
valve means disposed in said housing for preventing fluid from passing from said inlet to said outlet, said valve means comprising a valve seat forming part of said fluid passage, a movable valve body having one end which engages said valve seat to prevent fluid from passing from said inlet to said outlet, a piezoelectric stack means disposed on said housing for moving said valve body towards said valve seat in response to electrical energy supplied to said piezoelectric stack means, and elastic partition means forming another part of said fluid passage connected between said piezoelectric stack means and the other end of said valve body for providing a fluid tight seal between said passage and said piezoelectric stack means; and driving force transmission member means for increasing the amount of movement transmitted from said piezoelectric stack means to said valve body, said driving force transmission member means comprising at least one tongue portion pivotally mounted on a support fixed to said housing, said tongue portion having at one end thereof a projection engaging said piezoelectric stack means and a free end at the other end thereof engaging said valve body, said free end being movable away from said piezoelectric stack means to a greater extent than the distance moved by said piezoelectric stack means in response to electrical energy supplied to said piezoelectric stack means.

15. The fluid control device of claim 14, wherein said piezoelectric stack means comprises a plurality of piezoelectric elements, a plurality of thin metallic plates, each of said plurality of piezoelectric elements being separated by one of said plurality of thin metallic plates to form a stack, a positive lead wire connected to every other one of said plurality of piezoelectric elements and a negative lead wire connected to the remaining piezoelectric elements, said stack of piezoelectric elements being movable in response to voltage applied across said lead to move said valve body.

16. The fluid control device of claim 15, wherein said piezoelectric stack means further includes a tubular member having one end thereof mounted on said housing, adjusting means disposed at the other end of said tubular member for supporting one end of said stack of piezoelectric elements and adjusting the position of said stack of piezoelectric elements within said tubular member.

17. The fluid control device of claim 16, wherein said piezoelectric stack means further including a pressing portion disposed on a free end of said stack of piezoelectric elements for moving said valve body towards said valve seat.

18. The fluid control device of claim 16, wherein said elastic partition means comprises a flexible bellows shaped member diposed within said tubular member and extending between said housing and said valve body to provide a fluid tight seal therebetween.

19. The fluid control device of claim 14, wherein said at least one tongue portion comprises a plurality of tongue portions.

* * * * *